United States Patent [19]

Sogard

[11] Patent Number: 5,784,166
[45] Date of Patent: Jul. 21, 1998

[54] POSITION RESOLUTION OF AN INTERFEROMETRICALLY CONTROLLED MOVING STAGE BY REGRESSION ANALYSIS

[75] Inventor: Michael R. Sogard, Menlo Park, Calif.

[73] Assignee: Nikon Corporation, Tokyo, Japan

[21] Appl. No.: 626,863

[22] Filed: Apr. 3, 1996

[51] Int. Cl.$^6$ .................................................... G01B 9/02
[52] U.S. Cl. ..................... 356/363; 356/400; 250/559.3
[58] Field of Search ............................ 356/358, 363, 356/400, 401; 250/559.29, 559.3, 548; 355/50, 53

[56] References Cited

U.S. PATENT DOCUMENTS 4,546,355  10/1985  Boles .
5,182,615   1/1993  Kurosawa et al. ..................... 356/400

OTHER PUBLICATIONS

Vanderkooy et al., "Resolution Below the Least Significant Bit in Digital Systems With Dither", J. Audio Eng. Soc., vol. 32, No. 3, Mar. 1984.

Primary Examiner—Samuel A. Turner
Attorney, Agent, or Firm—Skjerven, Morrill, MacPherson, Franklin and Friel LLP; Michael J. Halbert

[57] ABSTRACT

A method and apparatus for achieving high position resolution of a moving stage in a lithographic system utilized for the manufacture of semiconductor integrated circuits. A series of values of the stage position are measured using an interferometric system, and a present position of the stage is estimated using regression analysis applied to a selected number of the series of measured values. The resulting predicted position is of higher resolution than a single stage position measurement of the interferometric system.

63 Claims, 4 Drawing Sheets

POSITION RESOLUTION OF AN INTERFEROMETRIALLY CONTROLLED MOVING STAGE BY REGRESSION ANALYSIS

BACKGROUND OF THE INVENTION

1. Field of the Invention

This invention relates generally to position resolution of a moving component in a system and, more particularly, to a method of achieving high position resolution of moving stages in a system and, even more particularly, to a method of achieving very precise position resolution and very precise resolution positioning of moving stages in a lithographic system used for the manufacture of semiconductor integrated circuits.

2. Related Art

To achieve the increasingly smaller submicron dimensions required for the continued improvement in the performance of semiconductor integrated circuits it is necessary to achieve a concomitant increasingly higher resolution in the determination of the positions of the various components in the lithographic systems used to manufacture the semiconductor integrated circuits.

The major effort to achieve better position resolution has centered around the improvement of the structural elements in lithographic systems to better control the movements and therefore the positions of moving components in lithographic systems. In semiconductor lithographic systems, a mask (also referred to as a reticle) is imaged through a reduction-projection lens system onto a wafer. In a scanning lithographic system, for example, the mask and wafer are mounted on structures, called stages, that move simultaneously so as to continuously project portions of the mask onto the wafer through the projection lens system. Scanning, as opposed to exposure of the entire mask at once, allows for the projection of mask patterns that exceed in size in the direction of scanning that of the image field of the projection lens system.

The stages, including all support structures, require very high precision in manufacturing and operation. Mechanical structures designed to achieve high positioning resolution are well known and examples of such structures and stages used in lithographic systems used to manufacture semiconductor integrated circuits and problems affecting the stages are disclosed in "Static Pressure Air Surface Stage," U.S. Pat. No. 4,648,723, issued Mar. 10, 1987 and "Static Pressure Air Surface Stage," U.S. Pat. No. 4,648,724, issued Mar. 10, 1987. Other systems are disclosed in the following copending and commonly owned U.S. Patent Applications: U.S. patent application Ser. No. 08/266,999, filed Jun. 27, 1994 now abandoned, titled "Electromagnetic Alignment and Scanning Apparatus," invented by Akimitsu Ebihara; U.S. patent application, Ser. No. 08/495,044, filed Jun. 27, 1995, titled "Dual Guide Beam Stage Mechanism With Yaw Control," invented by W. Thomas Novak; and U.S. patent application, Ser. No. 08/325,740, filed Oct. 19, 1994, now U.S. Pat. No. 5,623,853, issued on Apr. 29, 1997, titled "Precision Motion Stage With Single Guide Beam and Follower Stage, invented by W. Thomas Novak, Zahirudeen Premji, Uday G. Nayak and Akimitsu Ebihara. See also U.S. Pat. No. 5,040,431 issued Aug. 20, 1991 to Sakino et al. and U.S. Pat. No. 4,667,139 issued May 19, 1987 to Hirai et al. All of the above patent documents are incorporated herein by reference.

The background art described in these patent documents is directed to improvements in the structural devices required for the precise control of the movement of moving stages in lithographic systems so that the stages move in accordance with desired movement profiles. A movement profile shows a desired displacement as a function of time; for a scanning lithographic system the displacement takes place along an axis with respect to time. FIG. 3 shows a typical movement profile with displacement plotted on the y-axis and time plotted on the x-axis. However, many factors prevent the actual movement of a moving stage from precisely coinciding with the desired movement prescribed by the respective movement profile. For example, the numerous cables and other necessary connections, including electrical cables, fiber optic cables, coolant tubes, vacuum tubes and air hoses which are connected to the stage from external devices impose significant amounts of drag and mechanical forces, both steady and impulsive, on the moving stages. These forces degrade the performance of a lithography system by preventing the stages from moving in accordance with their respective movement profiles. In addition, the stages described in the background art can also suffer from reduced performance due to the relatively high mass of the stages which typically carry the electromagnetic drive motor magnets for positioning the stage. These electromagnetic drive motor magnets are high mass devices and the high mass reduces the stages' mechanical resonance frequency and thereby lowers the stages' performance. If the stages are made stiffer to compensate, which usually means added mass, the added mass tends to exacerbate the problem.

There have been several efforts to increase the position resolution of a moving stage in a lithographic system. Position resolution is determined by the resolution of the measurement device. In the heterodyne interferometric systems commonly used to determine the position of a stage in a lithographic system, this is often a digital system which means that the resolution is limited by the value represented by the least significant bit (lsb). For example, a current state-of-the-art system has a resolution of ±5 nanometers because the value represented by the least significant bit is 10 nanometers. Systems being developed reportedly are using newly developed electronics to achieve a value of 0.6 nanometers represented by the least significant bit, corresponding to a single measurement uncertainty of ±0.3 nm. However, for some applications, such as heterodyne interferometric systems, in which the dispersive properties of air are used to correct for air density fluctuations, still higher position resolution is needed.

For example Ishida (see A. Ishida, Jap. J. Appl. Phys. 28, L473(1989)) shows that if the stage position is measured interferometrically at two different wavelengths $\lambda 1$ and $\lambda 2$, and along the same optical path, then the optical pathlength D at $\lambda 1$, corrected for air density fluctuations, is given by $$D = D(\lambda 1) - A(D(\lambda 2) - D(\lambda 1)),$$

where $D(\lambda 1)$ and $D(\lambda 2)$ are the uncorrected interferometrically measured optical pathlengths at wavelengths $\lambda 1$ and $\lambda 2$ respectively. The quantity A is defined as $$A = (n(\lambda 2) - 1)/(n(\lambda 2) - n(\lambda 1)),$$

where $n(\lambda 1)$ and $n(\lambda 2)$ are the indices of refraction of the air at the two wavelengths. Clearly the second term $A(D(\lambda 2) - D(\lambda 1))$ represents a correction to $D(\lambda 1)$ for the air fluctuations.

From the dispersive properties of the index of refraction of air, it can be shown that for visible or near visible light A is typically greater than 10. For example, for the wavelengths λ1=488 nm, and λ2=244 nm, used by Ishida, A=12.7. For longer wavelengths A is even greater.

It follows that any errors associated with the two beams will be multiplied by A, in terms of their impact on the corrected optical pathlength D. This also means that the resolution of the correction term will be A times larger than the resolution of D(λ1) and D(λ2), as determined by the lsb of the interferometer system. Therefore very small lsb's are required for this system to attain high resolution.

One proposed method to improve the resolution of heterodyne interferometric measurement systems is to mix the interferometer signal, before digitization, with a dithered signal or a well characterized noise signal. The combined signal is then digitized and averaged over a number of measurements, during which the added signal is varied. Provided the amplitude of the added signal covers a range of several least significant bits, the average of the dithered values has a higher resolution than a single least significant bit. For an explanation of dithering see "Resolution Below the Least Significant Bit in Digital Systems with Dither", John Vanderkooy and Stanley P. Lipshitz, Journal of the Audio Engineering Society, Vol 32, No 3, March 1984. In the case of lithographic systems utilized to manufacture semiconductor integrated circuits this averaging method must be performed very rapidly, over a short time period, so that degrading effects do not affect the resulting wafers and the chips cut from the wafers.

The averaging method using dithering only applies when the stage is traveling at very low speed so that motion during the averaging period is negligible. For example, if 25 measurements are averaged together and the minimum update time allowed by the electronics associated with the interferometric measurement system is 10 microseconds, the total averaging time is $25*10*10^{-6}$ (measurements) * (microseconds/measurement)=250 microseconds. If the total stage displacement is to be less than 10 nm during the total averaging time, the stage velocity has to be less than $10^{-7}$ centimeter per $250 \times 10^{-6}$ seconds=0.4 microns per second and for the systems that will achieve 0.6 nanometer resolution for the least significant bit, the stage velocity must be less than 2.4 microns per second. As a result, this approach is only appropriate for a lithographic stepper stage, where the stepper stage is making fine adjustments near its final position. As is well known, a stepper lithographic system is one in which the entire mask (reticle) representing an entire chip is projected onto the wafer at one time. The wafer stage is stepped from one chip location of the wafer to another until the entire wafer has been exposed.

In a scanning lithographic system, only a part, typically a narrow slit-like region, of the mask is imaged onto the wafer at any instant. By appropriate, coordinated scanning motions of the mask and wafer stages, the entire mask pattern is sequentially transferred to the wafer. As discussed above, there are factors that prevent the actual movement of a stage from precisely coinciding with the desired movement and, as a result, will cause performance degradation, including failure, in the resulting semiconductor integrated circuits. Another probable effect is that the yield (the number of good chips from a wafer) is very low and can be zero.

One way to increase the resolution of a given stage interferometer system is to increase the number of times the interferometer beam travels between the interferometer beam splitter and the reflecting element on the moving stage. In the simplest case the interferometer beam makes a single round trip, so the optical pathlength is given by OPL=2 nL, where n is the average index of refraction of the air along the beam, and L is the physical distance between the beam splitter and the stage reflective element. Interferometer optics can be designed so that the total optical pathlength becomes 2 NnL where N is an integer. Since the optical pathlength is the measured quantity, the stage position is determined to be given by $L_{measured}$=OPL/2 Nn. Therefore the resolution of the stage position can be improved by increasing N. In fact, many stage interferometer systems employ N=2 (e.g. see R. Baldwin and G. Siddall, "A double pass attachment for the linear and plane mirror interferometer", Proc. SPIE 480, 78(1984)). The interferometer system described earlier with an lsb=0.6 nm has N=2.

However, this approach has an undesirable consequence. The stage velocity is given by $v_{stage}=dL_{measured}/dt$. This means that the rate of change of the optical pathlength is dOPL/dt=2 Nn$v_{stage}$. The stage motion causes a shift in frequency $\Delta f_{stage}$ of the reflected light by the Doppler effect:

$$\Delta f_{stage}=dOPL/\lambda dt=2Nnv_{stage}/\lambda,$$

where λ is the laser wavelength.

In a heterodyne laser interferometer, laser light of two slightly different frequencies is used. The frequency difference Δf, the heterodyne frequency, must always exceed the maximum frequency shift caused by the stage motion. This means that the maximum stage velocity is limited to $$v_{stage,max}<(\lambda/2Nn)(dOPL/dt)<\Delta f/2Nn.$$

Therefore, the increase in resolution by this method is obtained at the expense of reduced maximum stage velocity. This is a very important practical consideration. Another implication is that if the resolution could be improved by some other means, it might be possible to reduce N in some cases, allowing a higher maximum stage velocity.

Because the position resolution obtainable from present measurement systems utilized to determine the location of moving stages is limited to either the value of the least significant bit in the electronics system used by the measurement system or to the more precise resolution offered by the dithering method described above but which can only be used for stages that move very slowly, the position of the rapidly moving stages in a scanning lithographic system may not be determined with sufficient precision. What is needed is a method to increase the position resolution of a rapidly moving stage in a scanning lithographic system, where significant stage motion occurs during the measurement period. In addition, any new position resolution method for a scanning stage must be able to determine the position at a significantly higher rate than for a stepper stage so that manufacturing throughput is not decreased.

SUMMARY

This invention is directed to a method of achieving high resolution of a predicted present position of a moving stage in a system requiring very precise position resolution. The predicted present position is determined using a series of measured positions of the stage.

The predicted present position of the stage is determined using values obtained by a measurement system which measures a series of positions of the moving stage. The measurement system is, for example, an interferometric measurement system. The position determination utilizes a very precise prediction calculation method, such as linear regression to estimate (predict) the present actual position.

The present predicted position of the stage is supplied to a servo system which compares the present predicted position of the stage to a position defined by a movement profile for that stage. The servo system corrects the motion of that stage so that future positions of the stage coincide more precisely with the position defined by the movement profile.

The present predicted position of a second stage is estimated using a very precise prediction calculation method, such as regression analysis using a selected number of measurements taken by a second interferometric measurement system. The present predicted position of the second stage is supplied to a second servo system which compares the present predicted position of the second stage with a position defined by a movement profile for the second stage. The second servo system corrects the motion of the second stage so that future positions of the second stage precisely coincide with a position defined by the movement profile for the second stage.

The system requiring high precision resolution is, for example, a lithographic system, the first stage is, for example, a wafer stage in the lithographic system and the second stage is, for example, a mask stage in the lithographic system. The image of a mask or reticle in the mask stage is transferred to a wafer on the wafer stage by a lens system with a selected magnification. The selected magnification determines the value of a function that determines the velocity of the first stage relative to the velocity of the second stage.

The present method is better understood upon consideration of the following detailed description, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and descriptions are illustrative in nature and not restrictive.

BRIEF DESCRIPTION OF THE DRAWINGS

The accompanying drawings incorporated in and forming a part of the specification, illustrate the present invention, and together with the description serve to explain the principles of the invention. In the drawings.

DETAILED DESCRIPTION

Figure 1:
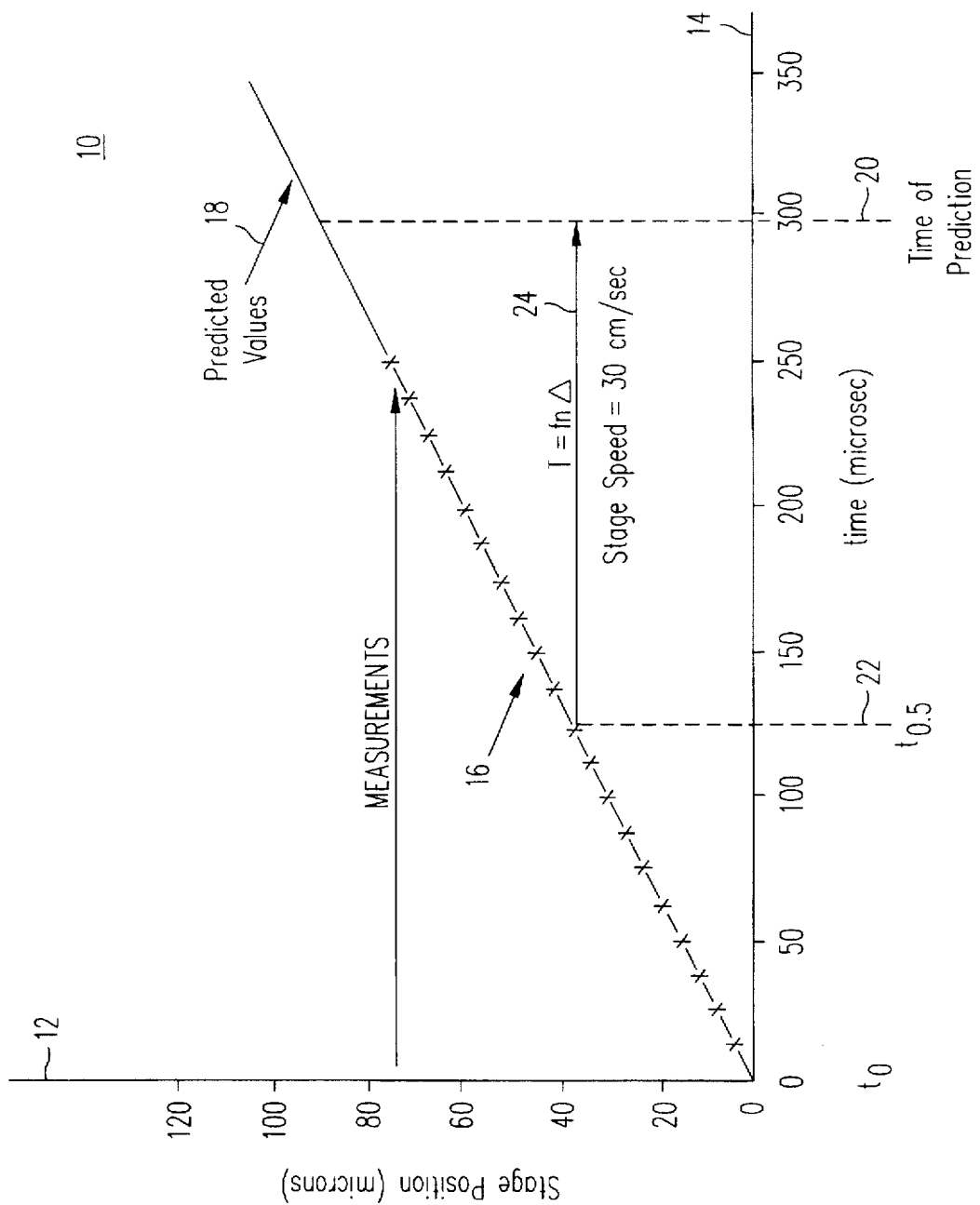
FIG. 1 is a graph illustrating the method of using linear regression according to the present invention.

The present disclosure is directed to a scanning lithographic system. However, it should be appreciated that the concepts of the present invention are applicable to any system that requires very precise position resolution of moving elements, so it is not intended that the present invention be restricted to a scanning lithographic system.

In a scanning lithographic system the mask stage and the wafer stage move at relatively high speeds during exposure and therefore must receive position information at a higher rate than does the wafer stage in a stepper lithographic system. The position update rate must be at least comparable to the stage servo bandwidth which is e.g. approximately 1 kHz (kiloHertz). This means that new position information is needed at least every 0.5 milliseconds. Whatever position update rate is used, stage position will be unknown between measurements, so assumptions are made about stage performance. For example, stage mechanical resonances beyond the servo bandwidth cannot be damped by the servo, therefore the design of the system must be such as to insure that the amplitudes of such resonances remain negligible. Consequently, it is reasonable to assume that for times shorter than the position update rate, and in the absence of applied forces, the stage velocity is approximately constant.

With the above assumptions, the position resolution of a scanning stage can be improved beyond the limitation imposed by the resolution of the least significant bit in the digitized electronic measurement system by predicting a present position of the stage using regression analysis. For constant stage velocity, a simple linear regression analysis is used to determine the straight-line relationship between position and time. There are many ways to determine this straight-line relationship, for example, a simplistic solution is to find the equation of the line that connects the greatest number of sample data points, that is, the measurements of the dependent variable, which in this case is displacement along the axis, in relation to the independent variable, which in this case is time.

Because there is a straight-line relationship, a simple regression analysis, such as linear regression analysis can be used. The traditional approach has been to use the "least squares criterion," and is the one used in this description. As is well known, regression analysis is a method of predicting a future value by analyzing past values.

The present predicted position of a moving stage is determined by a calculation using a selected number of past position measurements and a calculation time no greater than the time required for the stage to move to the present position. In this way, and to the accuracy of the fit, this method functions as a real time measurement system with very precise position resolution. The "fit" of the calculated value is how close the estimated straight-line fit is to the actual measured values. Using a predicted position rather than a measured position will introduce some error. However, a single time measurement may have an error associated with it which cannot be estimated. On the other hand, the position estimate based on regression analysis has an uncertainty which can be more accurately determined.

By making some reasonable assumptions, the expected resolution improvement using linear regression as compared to a single measurement can be calculated as follows. It is assumed that position measurements are made at regular time intervals $\delta$. It is also assumed that because the measurements are made at relatively high frequency, environmental noise will affect all the measurements to the same extent, i.e., noise does not contribute to the relative uncertainties of each measurement. For example, the frequency spectrum of fluctuations in air density cuts off above a few tens of Hertz, so any fluctuations present will affect all measurements in the measurement time interval to the same extent. It is further assumed that although some high frequency electronic noise may be present, the dominant uncertainty will come from the digitization, so the errors of all the points will be approximately the same, $\sigma = \pm \frac{1}{2}$*(least significant bit). (Strictly speaking, treating the digitization error as a flattopped distribution, the associated rms (root mean square) error would be $\pm(\frac{1}{12})^{1/2}$ *(least significant bit).

With these assumptions, the linear regression analysis (see H. Anderson, in "A Physicist's Desk Reference," American Institute of Physics, N.Y., 1989, Section 1.04A–1.04 C incorporated herein by reference), can be simplified as follows to provide a straight-line fit for uniformly spaced data, i.e., uniform time intervals. The dominant measurement error is assumed to be the digitization value of the least significant bit and is denoted by $\sigma$. Therefore, the positional error of each measurement is the same and the error associated with the fitted line can be determined in a simple form. Given the data $(x_1, \ldots, x_n)$ measured at $t_i = t_o + (i-1)\delta$, $i = 1, \ldots, n$, the straight line fit to the data, $x(t) = a + bt$ is determined as follows.

$$a = \frac{S_x S_{tt} - S_t S_{tx}}{D} \quad b = \frac{S_1 S_{tx} - S_t S_x}{D}$$

where $$S_1 = \sum_{i=1 \ldots n} \frac{1}{\sigma^2} = \frac{n}{\sigma^2}$$

$$S_t = \sum_{i=1 \ldots n} \frac{t_i}{\sigma^2} = \frac{1}{\sigma^2} \sum_{i=1 \ldots n} [t_o + (i-1)\delta]$$

$$S_t = \frac{1}{\sigma^2} n t_o - \frac{1}{2\sigma^2} \delta n + \frac{1}{2\sigma^2} \delta n^2$$

$$S_{tt} = \sum_{i=1 \ldots n} \frac{t_i^2}{\sigma^2} = \frac{1}{\sigma^2} \sum_{i=1 \ldots n} [t_o + (i-1)\delta]^2$$

$$S_{tt} = \frac{1}{\sigma^2} t_o^2 n - \frac{1}{\sigma^2} t_o \delta n + \frac{1}{6\sigma^2} \delta^2 n + \frac{1}{\sigma^2} t_o$$
$$\delta^2 n^2 + \frac{1}{2\sigma^2} \delta^2 n^2 + \frac{1}{3\sigma^2} \delta^2 n^3$$

$$S_x = \sum_{i=1 \ldots n} \frac{x_i}{\sigma_i^2} = \frac{1}{\sigma^2} \sum_{i=1 \ldots n} x_i$$

$$S_{tx} = \sum_{i=1 \ldots n} \frac{t_i x_i}{\sigma_i^2} = \frac{1}{\sigma^2} \sum_{i=1 \ldots n} t_i x_i$$

The determinate D is given by $$D = S_1 S_{tt} - S_t^2 = \frac{1}{6} n^2 \frac{(6t_o - 6t_o\delta + \delta^2 + b_n t_o \delta - 3n\delta^2 + 2n^2\delta^2)}{\sigma^4} -$$

$$\left[\frac{1}{\sigma^2} n t_o = \frac{1}{2\sigma^2} \delta n + \frac{1}{2\sigma^2} \delta n^2\right]^2 = \frac{1}{12} n^2 \delta^2 \frac{(-1 + n^2)}{\sigma^4}$$

These expressions can be simplified considerably in order to reduce the calculational effort. First, by measuring time relative to the earliest point used in the calculation, one can set $t_o = 0$.

The above quantities can then be written as $$S_t = S_1 \delta(n - 1)/2$$

$$S_{tt} = S_1 \delta^2 \frac{(n-1)(n-2)}{2}$$

$$S_{tx} = \frac{\delta}{\sigma^2} \sum_{i=1}^{n} x_i$$

$$S_x = \frac{1}{\sigma^2} \sum_{i=1}^{n} x_i$$

Note that $S_1$, $S_t$, $S_{tt}$, and D are now constants, so they only have to be determined once.

Now consider $S_x$ and $S_{tx}$ which depend on the measurements. If the integer N is associated with the data point measured at $t_o$, then $S_x$ determined from data starting at $t_o$ can be written as $$S_x(N) = \frac{1}{\sigma^2} \sum_{i=1}^{n} x_{N+i-1}$$

Similarly, $S_x$ determined from data starting at $t_o + \delta$ can be written as $$S_x(N+1) = \frac{1}{\sigma^2} \sum_{i=1}^{n} x_{N+i}$$

But this can also be written as $$S_x(N+1) = S_x(N) + \frac{(x_{N+n} - x_N)}{\sigma^2}$$

Thus knowing $S_x(N)$ at $t_o$, the value at $t_o + \delta$ is just the sum of 3 terms, not n terms.

By a similar argument it can be shown that $$S_{tx}(N+1) = S_{tx}(N) - \delta S_x(N) + (n-1)\frac{\delta}{\sigma^2} x_{N+n} + \frac{\delta}{\sigma^2} x_n$$

Thus $S_{tx}(N+1)$ can be constructed from the sum of just four previously determined terms, rather than a sum of n products.

Therefore the calculational time can be expected to be quite short. For example, the Texas Instruments TMS320C40 digital signal processor (DSP) can do floating point additions and multiplications in about 50 nsec. Therefore, the total calculational time is negligible compared to the data acquisition time.

The variance of the fitted line at time t is given by $$\text{variance} = \frac{1}{S_1} + \frac{S_1}{D}\left(t - \frac{S_t}{S_1}\right)^2$$

Substituting from above gives $$\text{variance} = \frac{1}{n} \sigma^2 + \frac{12}{n} \frac{\sigma^2}{[\delta^2(-1+n^2)]} \left[t - \left(t_o - \frac{1}{2}\delta + \frac{1}{2}\delta n\right)\right]$$

For n >> 1, $$\text{variance} = \frac{1}{n} \sigma^2 + \frac{12}{n} \frac{\sigma^2}{\delta^2 n^2} \left[t - \left(t_o + \frac{1}{2}\delta n\right)\right]$$

Referring to FIG. 1, there is shown a graph 10 illustrating the method of using linear regression according to the present invention and shows the relationships between the values used and calculated. Stage position is shown on the y-axis 12 and time is shown on the x-axis 14. The individual stage measurements are shown at 16 and the predicted values of stage positions are shown at 18. A time of prediction is shown at 20 and the value $t_{0.5}$ is shown at 22.

Letting the time midway through the stage measurements be $t_{0.5}$, shown at 22, FIG. 1, then $$t_{0.5} = t_o + \frac{1}{2} \delta n$$

$$\text{and variance} = \frac{\sigma^2}{2} + \frac{12}{n} \frac{\sigma^2}{\delta^2 n^2} (t - t_{0.5})^2$$

If $t-t_{0.5}=T=f\delta n$, shown at 24, FIG. 1, then $$\text{variance} = \frac{\sigma^2}{n} + \frac{12}{n}\sigma^2 f^2 = \frac{\sigma^2}{n}(1+12f^2)$$

The error in position of the fit is $$\sigma_x = \sigma\left(\frac{1+12f^2}{n}\right)^{1/2}$$

where n=number of stage measurements, f is the time T of the prediction, measured from the time $t_{0.5}$, FIG. 1 at 22, midway through the stage measurements, and normalized by the total duration of the stage measurements, that is, $$f=T/n\delta.$$

As an example, at the last point measured, $$f=0.5,$$

and $$\sigma_x=2\sigma/n^{1/2}.$$

For n=25 (25 data points), $\sigma_x=0.4\sigma$, which indicates that the error is reduced by a factor of 2.5. For 100 data points (n=100), $\sigma_x=0.2\sigma$ and the error is reduced by a factor of 5.

If the stage position is predicted at time $t_{0.5}$ after the last stage measurement when f=1.0, $\sigma_x=3.606 \sigma/n^{1/2}$. For n=25, $\sigma_x=0.7212\sigma$ and for n=100, $\sigma_x=0.3603\sigma$.

This method can be extended if desired to the case of a stage undergoing acceleration or deceleration. From the previous assumptions, for times much shorter than the servo update time, one can assume the force generated on the stage by the servo controlled motor to be constant. Therefore, the acceleration will be constant. Linear regression can again be used. However, instead of a straight line fit, an expression of the form $x(t)=a+bt+ct^2$ is used, and the previous linear regression analysis is modified in well-known ways to obtain the 3 constants a, b, and c.

Figure 2:
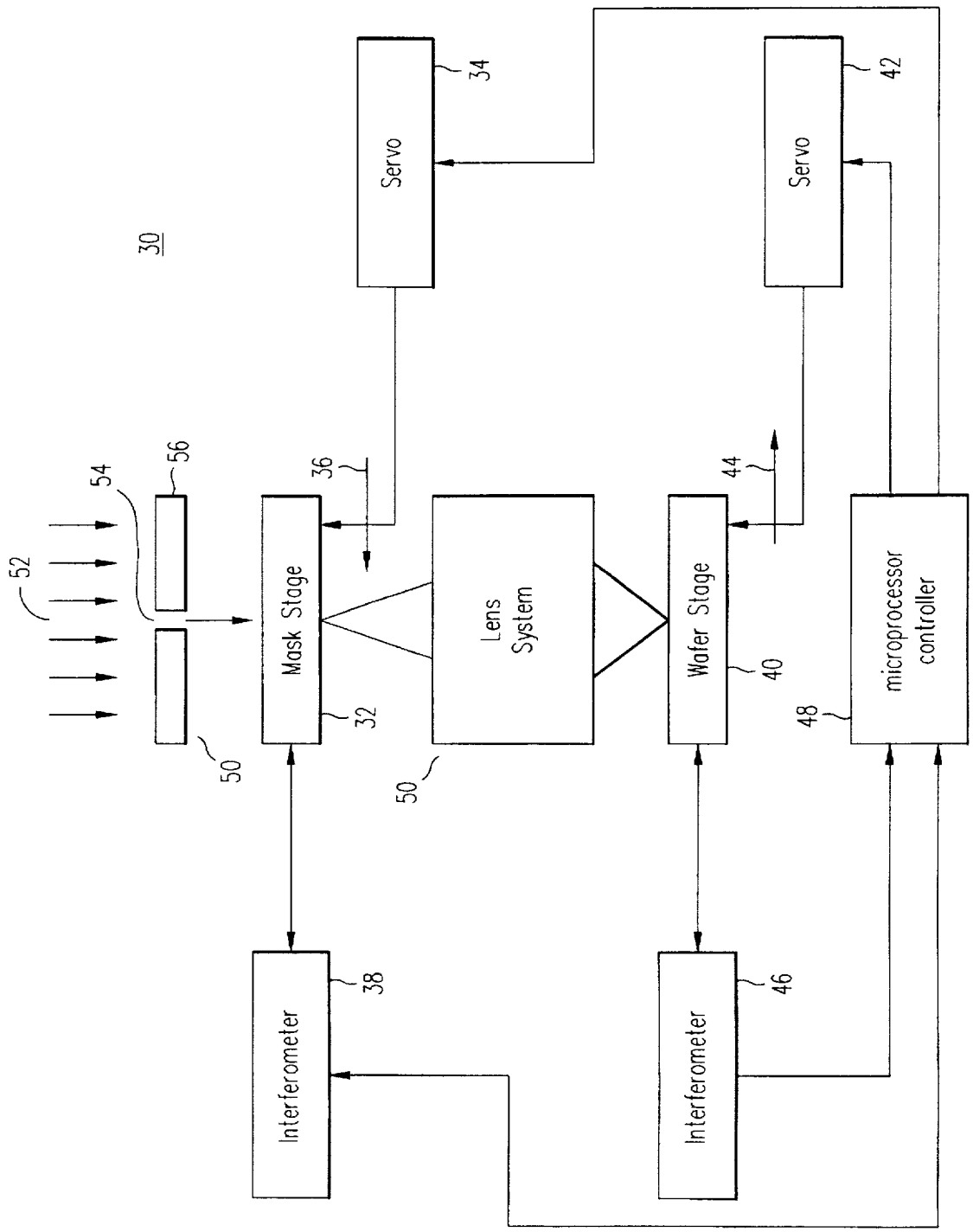
FIG. 2 is a block diagram of a lithographic system used in the manufacture of semiconductor integrated circuits.

FIG. 2 shows a block diagram of a lithographic system used in the semiconductor industry to manufacture semiconductor integrated circuits. The lithographic system 30 includes a movable mask stage 32, a servo system 34 connected to mask stage 32 in such a way so as to cause mask stage 32 to move in the direction indicated by arrow 36, and an interferometer system 38 to measure the position of mask stage 32. The lithographic system 30 also includes a movable wafer stage 40, a servo system 42 connected to wafer stage 40 in such a way to cause wafer stage 40 to move in the direction indicated by arrow 44, and an interferometer system 46 to measure the position of wafer stage 40. Interferometer system 38 and interferometer system 46 provide to microprocessor controller 48 position values of mask stage 32 and wafer stage 40 respectively. Microprocessor controller 48 is connected to servo 34 and servo 42. Lithographic system 30 also includes a projection lens system 50 disposed between mask stage 32 and wafer stage 40. Associated with lens system 50 is a source of radiation, indicated by the arrows shown at 52, and a slit 54 formed in an opaque member 56.

Figure 3:
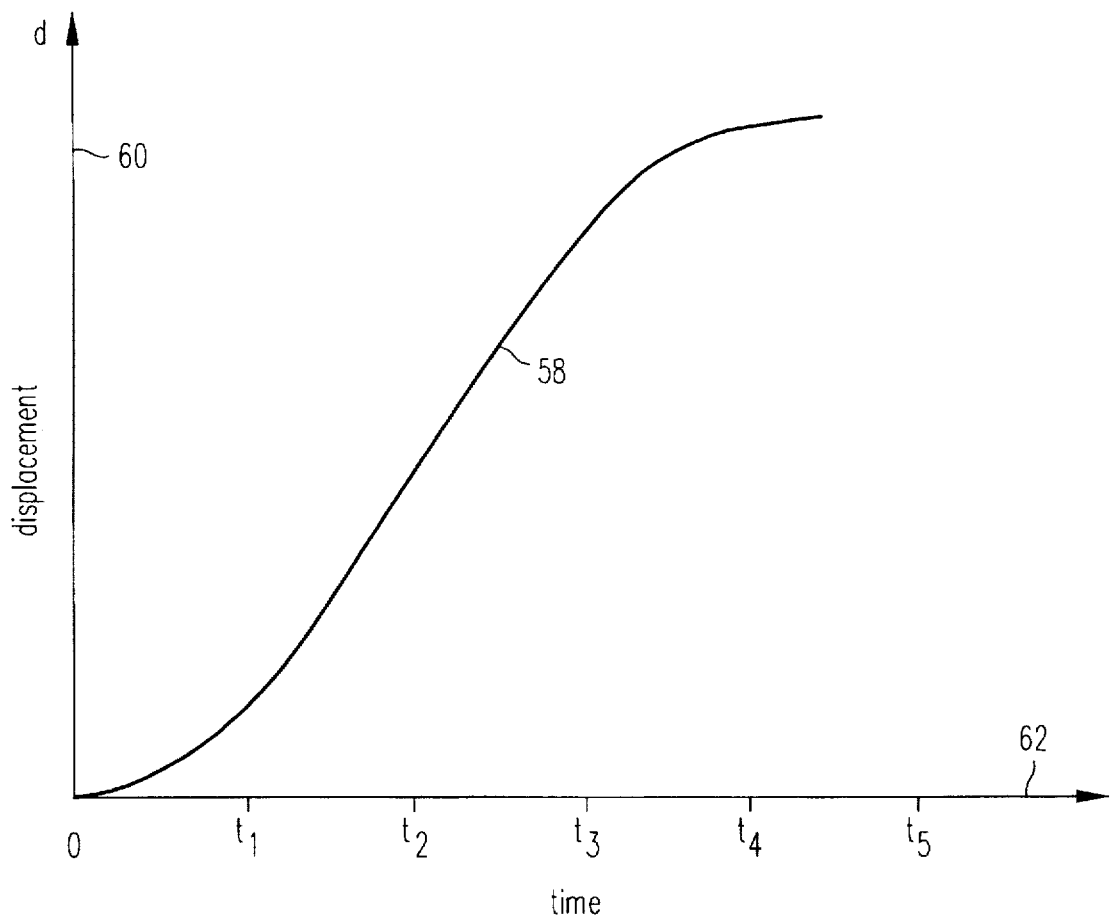
FIG. 3 shows an illustrative movement profile of a stage that prescribes the desired movement of that stage.

FIG. 3 shows an illustrative movement profile 58. The movement profile represents a desired displacement d represented on the y-axis 60 versus time t represented on the x-axis 62.

Figure 4:
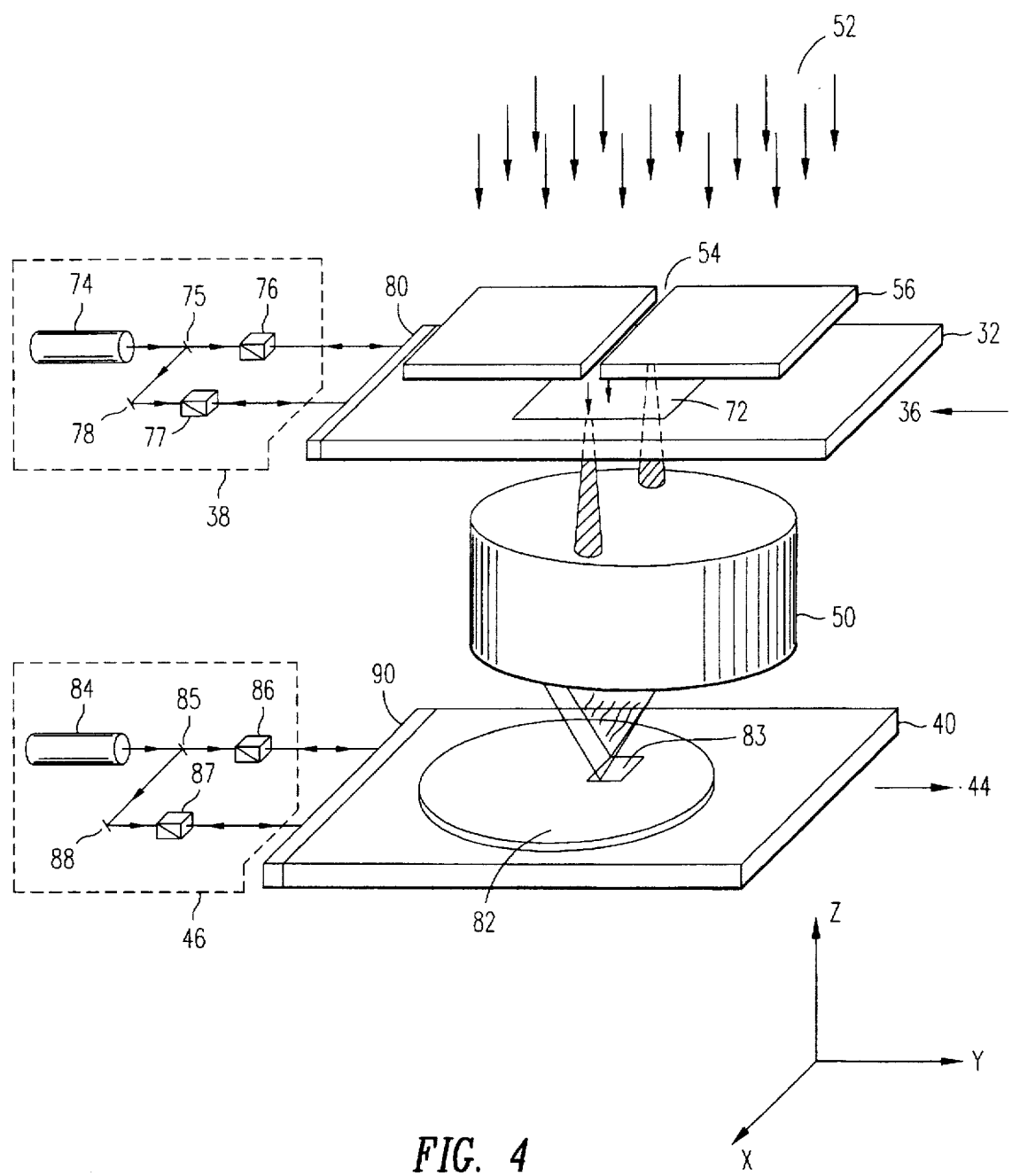
FIG. 4 is a perspective view of the lithographic system utilized in the manufacture of semiconductor integrated circuits.

FIG. 4 shows a perspective view of the lithographic system 30; like components have like numerals as shown in FIG. 2. Mask stage 32 is shown with an outline of a mask 72 disposed on mask stage 32. Interferometer system 38 is shown in more detail with a laser 74, a beam splitter 75, interferometers 76 and 77, and a mirror 78. Attached to mask stage 32 is a mirror 80 used by interferometer system 38 in determining the position of mask stage 32. Wafer stage 40 is shown with a wafer 82 disposed thereon. Similarly, interferometer 46 is shown in more detail with a laser 84, a beam splitter 85, interferometers 86 and 87, and a mirror 88. Attached to wafer stage 40 is a mirror 90 used by interferometer system 46 in determining the position of wafer stage 40.

Referring now to the Figures, the operation of a representative photolithographic system will be explained, however, it is to be understood that the present invention may be used by any type of lithographic system or any other system in which it is necessary to precisely determine the position of a moving element. Specifically, in the case of lithographic systems used for the manufacture of semiconductor integrated circuits there are different types of systems and which are comprehended by this invention. There are lithographic systems in which visible light is used and other systems in which other types of radiation can be used such as the lithographic systems which use x-ray radiation.

FIGS. 2 and 4 show a lithographic system 30 in accordance with the present invention. A wafer 82 is placed on wafer stage 40 whose position is controlled by servo 42, FIG. 2. Servo 42 causes wafer stage 40 to move in accordance with a movement profile such as the one illustrated is FIG. 3. As can be appreciated, at time 0 the stage is at rest, and it takes a period of time for the stage to achieve a steady state velocity at approximately time $t_1$. Servo 42 causes wafer stage 40 to move in the direction of arrow 44. Referring again to FIG. 3, the section of the movement profile that is used by the system for lithography is the portion of the curve from about time $t_1$ to time $t_3$ where the movement profile is designed to be linear. At approximately time $t_3$ the servo 42 causes wafer stage 40 to begin decelerating and come to rest. During the time $t_1$ to $t_3$ a single chip 83 on the wafer is exposed.

Similarly servo 34 is connected to mask stage 32 is such a way as to cause mask stage 32 to move in the direction of arrow 36. Servo 34 is also supplied with a movement profile such as the one shown in FIG. 3.

Lens system 50 is a projection lens system with a selected magnification and in most cases the magnification is less than one. The selected magnification determines the relative speeds of the stages. For example, if the magnification is 0.25 (or a demagnification of 4) the mask stage is required to move at a velocity four times as fast as the wafer stage, that is, the velocity of the mask stage 32=4*velocity of wafer stage 40.

As shown in FIG. 2, servo 34 and servo 42 receive inputs from microprocessor controller 48. In turn, microprocessor controller 48 receives inputs from interferometer system 38 and interferometer system 46. The interferometer systems are used to measure the stage position. However, because the stage is less than perfect, in addition to linear translation, it may also unintentionally rotate slightly during motion. The most important rotation practically is about a vertical axis, and this is referred to as "yaw". The yaw is corrected by averaging the position measurements made by the two interferometers 76 and 77 for the mask stage and 86 and 87 for the wafer stage. The resolution improvement described herein can be applied to all interferometers, or it can be applied to the averaged position of each interferometer pair.

Interferometer system 38 measures the position of mask stage 32 at time intervals as discussed above and as shown at 16, FIG. 1. These measurements are input to microprocessor controller 48 which calculates, using a computer program resident in microprocessor controller 48, a very precise predicted present position of mask stage 32 using regression analysis. Writing such a program is within the skill of one of ordinary skill in the art, given this description. This precise predicted present position is used in two ways. First, the predicted present position is used to determine (1) if mask stage 32 is moving in accordance with its movement profile and, if not, and (2) if necessary, to determine the correction needed to bring the movement of mask stage 32 into compliance with the movement profile for mask stage 32 or, as discussed below, in the correct spatial location relative to wafer stage 40. Second, the predicted present position is used to determine the relative position of mask stage 32 with respect to wafer stage 40. The predicted present position of mask stage 32 is compared to a position defined by the movement profile for mask stage 32 to determine if mask stage 32 is moving in accordance with the movement profile for mask stage 32.

At the same time as the calculations are being made with respect to mask stage 32, interferometer system 46 measures the position of wafer stage 40 at time intervals as discussed above and as shown at 16, FIG. 1. As should be appreciated, because wafer stage 40 and mask stage 32 are moving at different velocities, the slope of the line in FIG. 1 will be different for each stage since the displacement along the axis will be different for equal time periods. These measurement values are input to microprocessor controller 48 which calculates, using the resident computer program described above, a precise predicted present position of wafer stage 40 using regression analysis. As with the predicted present position of mask stage 32 the calculated precise present position of wafer stage 40 is used in two ways. First, the predicted position is used to determine (1) if wafer stage 40 is moving in accordance with its movement profile and, if not, and (2) if necessary, to determine the correction needed to bring the movement of wafer stage 40 into compliance with the movement profile for wafer stage 40. Second, the predicted present position is used to determine the relative position of wafer stage 40 with respect to mask stage 32. As can be appreciated, mask stage 32 and wafer stage 40 can be affected by different influences and be out of compliance, by different amounts and in different directions, with their respective movement profiles. As can also be appreciated, the most important factor to be determined is the precise relative present position of mask stage 32 with respect to the precise present position of wafer stage 40 since the accuracy of the finished wafer and chips cut from the wafer depends upon precise positioning of semiconductor elements on each chip. The precise positioning information is used by microprocessor controller 48, servo 34, and servo 42 to correct, if necessary, the motions of either wafer stage 40, mask stage 32, or both, to ensure that the positions of the stages are aligned with very high precision.

Above-mentioned mask stage 32 is one plate, but mask stage 32 can be a combination of a fine stage and a coarse stage. The fine stage moves on the coarse stage by a detailed pitch so as to coincide with a next estimated position. The coarse stage moves at a predetermined velocity by a rough pitch. In this case, there must be one additional interferometer system and one more servo motor. One interferometer measures the position of the fine stage, and another interferometer measures the position of the coarse stage.

The system described so far allows resolution to be enhanced for a lithography system with stages moving in directions 36 and 44. However, the relative locations of mask and wafer in the directions orthogonal to directions 36 and 44, and lying in the plane of the wafer and mask, are also essential for normal operation. In the step and scan system shown, only a single chip site 83 is exposed with each travel of the mask stage. In order to expose all chip sites on the wafer, the wafer stage must be displaced precisely in both X and Y directions. Thus interferometer systems similar to 38 and 46 are required to measure the stage positions in the orthogonal direction as well. However, since stage yaw is already determined by interferometer systems 38 and 46, these new interferometer systems may contain only a single interferometer each.

Wafer 82 is exposed to the exposure illumination repeatedly to make e.g. an IC chip or liquid crystal substrate. So, the position of chip 83 is accurately measured with the alignment sensors (not shown) after the first layer of wafer 82 is exposed. This measurement value is input to controller 48 and is transmitted to the exposure system (not shown).

Therefore, when the movement of the mask stage 32 and the wafer stage 40 enter the straight line part of the curve (from time t1 to time t3) as shown in FIG. 3, lithographic system 30 begins exposing the wafer.

The foregoing description of the embodiment of the invention has been presented for purposes of illustration and description. It is not intended to be exhaustive or to limit the invention to the precise form disclosed. For example, other methods of analysis could be used to determine the present positions as described above. Other methods such as maximum likelihood estimation and chi-square fitting are basically the same as linear regression. A "robust estimation", analysis is somewhat different. This technique is particularly useful when a set of data has a few points which are significantly different from the behavior of the rest of the set; these are termed "outliers," and are assumed to have resulted from external, uncontrolled influences. If such outliers occur in a system, robust statistics can deal with such a situation better than conventional linear regression and, of course, if these external uncontrolled effects occur during the position measurement using conventional techniques, a potentially large, but unknown, error can occur. It is intended that an analysis using robust statistics is included in the generic term "regression analysis," as used above. For a description of these statistical analysis methods see "An Introduction to Error Analysis," John Taylor, University Science Books, 1982 and "Numerical Recipes in C," W. Press, B. Flannery, S. Teukolsley, W. Vetterling, Cambridge, 1988.

Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What I claim is:

1. A method of achieving high position resolution in a precision motion system having at least one moving stage, comprising the steps of:

measuring a series of positions of said at least one moving stage; and estimating a present position of said at least one moving stage using a selected number of the series of measured positions of said at least one moving stage.

2. The method of claim 1, wherein said step of measuring comprises a step of measuring interferometrically.

3. The method of claim 2, wherein said step of estimating a present position of said at least one moving stage comprises a step of estimating using regression analysis.

4. The method of claim 3, further comprising the step of controlling the movement of said at least one moving stage with a first servo system.

5. The method of claim 4, further comprising the step of providing said first servo system a first movement profile to control the movement of said at least one moving stage.

6. The method of claim 4, wherein said regression analysis is a linear regression.

7. The method of claim 6, wherein said at least one moving stage is a precision stage, and wherein said regression analysis is performed for time periods shorter than an update time of said first servo system.

8. The method of claim 5, further comprising the steps of:
providing said estimated present position of said at least one moving stage to said first servo system;
comparing said estimated present position of said at least one moving stage with a first position defined by said first movement profile; and
correcting the movement of said at least one moving stage, whereby a next estimated present position substantially coincides with a second position defined by said first movement profile.

9. The method of claim 8 wherein said system has at least a second moving stage, and further comprising the steps of:
measuring a series of positions of said at least a second moving stage; and
estimating a present position of said at least a second moving stage using a selected number of the series of measured positions of said at least a second moving stage.

10. The method of claim 9, wherein said step of measuring a series of positions of said at least a second moving stage comprises a step of measuring interferometrically.

11. The method of claim 10, wherein said step of estimating a present position of said at least a second moving stage comprises a step of estimating using regression analysis.

12. The method of claim 11, further comprising a step of controlling the movement of said at least a second moving stage with a second servo system.

13. The method of claim 12, further comprising the steps of:
providing said second servo system a second movement profile to control the movement of said at least a second moving stage;
comparing said estimated present position of said at least a second moving stage with a first position defined by said second movement profile; and
correcting the movement of said at least a second moving stage, whereby the estimated next present position of said at least a second moving stage substantially coincides with a second position defined by said second movement profile.

14. The method of claim 13, wherein said step of providing a second movement profile comprises the step of providing a second movement profile that is a function of said first movement profile.

15. The method of claim 14, further comprising a step of imaging portions of a mask on said at least one moving stage wherein said at least one moving stage is a mask stage in a lithographic system onto a wafer disposed on said at least a second moving stage wherein said at least a second moving stage is a wafer stage in said lithographic system with a lens system disposed between said mask stage and said wafer stage.

16. The method of claim 15, further comprising the step of selectively adjusting a magnification of said lens system.

17. The method of claim 16, wherein said steps of providing first and second movement profiles comprise the steps of providing first and second movement profiles which comprise displacement versus time profiles thereby defining a mask stage velocity and a wafer stage velocity at each point of said first movement profile and second movement profile.

18. The method of claim 17, wherein said step of providing a second movement profile comprises the step of providing a second movement profile that is a function of said first movement profile, wherein said function is determined by said selectively adjusted magnification of said lens system.

19. An apparatus for achieving high position resolution, comprising:
at least one moving stage;
a first measurement system located to measure a series of positions of said at least one moving stage; and
an estimation system connected to said first measurement system to estimate a present position of said at least one moving stage using a selected number of the series of measured positions of said at least one moving stage.

20. The apparatus of claim 19, wherein said first measurement system comprises a first interferometer system.

21. The apparatus of claim 20, wherein said estimation system is a microprocessor controller wherein said microprocessor controller estimates a present position of said at least one moving stage using regression analysis.

22. The apparatus of claim 21, further comprising a first control system coupled to said at least one moving stage and to said estimation system to control the movement of said at least one moving stage.

23. The apparatus of claim 22, wherein said first control system comprises a first servo system wherein said first servo system controls the movement of said at least one moving stage in accordance with a first movement profile.

24. The apparatus of claim 23, wherein said regression analysis is a linear regression.

25. The apparatus of claim 24, wherein said at least one moving stage is a precision stage, and wherein said regression analysis is performed for time periods shorter than an update time of said first servo system.

26. The apparatus of claim 23, wherein said first servo system compares said present predicted position of said at least one moving stage with a first position defined by said first movement profile and corrects the movement of said at least one moving stage, whereby a next estimated present position of said at least one moving stage substantially coincides with a second position defined by said first movement profile.

27. The apparatus of claim 26, further comprising:
at least a second moving stage located space apart from said at least a first moving stage;
a second measuring system located adjacent said at least a second moving stage to measure a series of positions of said at least a second moving stage; and
wherein said microprocessor controller estimates a present position of said at least a second moving stage using a selected number of the series of measured positions of said at least a second moving stage.

28. The apparatus of claim 27, wherein said second measurement system comprises a second interferometer system.

29. The apparatus of claim 28, wherein said microprocessor controller estimates a present position of said at least a second moving stage using regression analysis.

30. The apparatus of claim 29, further comprising a second control system coupled to said at least a second moving stage and said a second measuring system to control the movement of said at least a second moving stage.

31. The apparatus of claim 30, wherein said second control system comprises a second servo system wherein said second servo system controls the movement of said at least a second moving stage in accordance with a second movement profile.

32. The apparatus of claim 31, wherein said second servo system compares said present predicted position of said at least a second moving stage with a first position defined by said second movement profile and corrects the movement of said at least a second moving stage, whereby a next estimated present position of said at least a second moving stage substantially coincides with a second position defined by said second movement profile.

33. The apparatus of claim 32, wherein:
said at least one moving stage is a mask stage in a lithographic system; and
said at least a second moving stage is a wafer stage in said lithographic system.

34. The apparatus of claim 33, wherein said second movement profile is a function of said first second profile.

35. The apparatus of claim 34, further comprising a lens system disposed adjacent to said wafer stage.

36. The apparatus of claim 35, wherein said lens system has a selected magnification.

37. The apparatus of claim 36, wherein said lens system is disposed between said mask stage and said wafer stage.

38. The apparatus of claim 37, wherein said selected magnification of said lens system determines said function between said first movement profile and said second movement profile.

39. The apparatus of claim 38, wherein said first movement profile and said second movement profile comprise displacement versus time profiles thereby defining said wafer stage velocity and said mask stage velocity at each point of said first and second movement profiles.

40. An apparatus for achieving high position resolution, comprising:
at least one moving stage;
means for measuring a series of positions of said at least one moving stage; and
means for estimating a present position of said at least one moving stage using a selected number of the series of measured positions of said at least one moving stage.

41. The apparatus of claim 40, wherein said means for estimating uses regression analysis to estimate the present position of said at least one moving stage.

42. The apparatus of claim 41, further comprising means for controlling the movement of said at least one moving stage.

43. The apparatus of claim 42, wherein said means for controlling controls the movement of said at least one moving stage in accordance with a first movement profile.

44. The apparatus of claim 42, wherein said regression analysis is a linear regression.

45. The apparatus of claim 44, wherein said at least one moving stage is a precision stage, said means for controlling includes a servo system, and wherein said regression analysis is performed for time periods shorter than an update time of said servo system.

46. The apparatus of claim 43, further comprising:
means for comparing said estimated present position of said at least one moving stage with a first position defined by said first movement profile; and
means for correcting the movement of said at least one moving stage whereby a next estimated present position of said at least one moving stage substantially coincides with a second position defined by said first movement profile.

47. The apparatus of claim 46, further comprising:
at least a second moving stage;
means for measuring a series of positions of said at least a second moving stage; and
means for estimating a present position of said at least a second stage using a selected number of the series of measured positions of said at least a second moving stage.

48. The apparatus of claim 47, wherein said means for estimating a present position of said at least a second stage uses regression analysis to estimate said present position of said at least a second moving stage.

49. The apparatus of claim 48, further comprising means for controlling the movement of said at least a second moving stage.

50. The apparatus of claim 49, wherein said means for controlling the movement of said at least a second moving stage controls the movement of said at least a second moving stage in accordance with a second movement profile.

51. The apparatus of claim 50, further comprising:
means for comparing said estimated present position of said at least a second moving stage with a first position defined by said second moving profile; and
means for correcting the movement of said at least a second moving stage whereby a next estimated present position of said at least a second moving stage substantially coincides with a second position defined by said second movement profile.

52. The apparatus of claim 51, wherein said first movement profile is a function of said second movement profile.

53. The apparatus of claim 52, wherein:
said means for controlling the movement of said at least one moving stage comprises a first servo system; and
said means for controlling the movement of said at least a second moving stage comprises a second servo system.

54. The apparatus of claim 53, wherein:
said at least one moving stage comprises a mask stage in a lithographic system; and
said at least a second moving stage comprises a wafer stage in said lithographic system.

55. The apparatus of claim 54, further comprising means for transferring an image of a mask disposed on said mask stage to a wafer disposed on said wafer stage.

56. The apparatus of claim 55, wherein said means for transferring comprises a lens system with a selected magnification.

57. The apparatus of claim 56, wherein said selected magnification determines said function.

58. The apparatus of claim 57, wherein said first movement profile and said second movement profile comprise displacement versus time profiles thereby defining said wafer stage velocity and said mask stage velocity at each point of said first and second movement profiles respectively.

59. The apparatus of claim 58, wherein said means for estimating a present position of said at least one moving stage and said means for estimating a present position of said at least a second stage comprises a microprocessor controller.

60. The apparatus of claim 59, wherein:

said means for measuring a series of positions of said at least one moving stage comprises a first interferometer system; and said means for measuring a series of positions of said at least a second moving stage comprises a second interferometer system.

61. The method of claim 1, wherein the measurement of the series of positions is made at regular time intervals while said at least one moving stage is moving, and wherein said estimate of said present position is made while said at least one moving stage is moving.

62. The apparatus of claim 19, wherein said first measurement system measures a series of positions at regular time intervals while said at least one moving stage is moving, and wherein said estimation system estimates a present position while said at least one moving stage is moving.

63. The apparatus of claim 40, wherein said means for measuring a series of positions of said at least one moving stage measures at a regular time interval while said at least one moving stage is moving, and wherein said means for estimating a present position of said at least one moving stage estimates while said at least one moving stage is moving.

* * * * *